US012575030B2

(12) United States Patent
Duan et al.

(10) Patent No.: US 12,575,030 B2
(45) Date of Patent: Mar. 10, 2026

(54) FIXING AUXILIARY DEVICE, FIXING DEVICE, AND ELECTRONIC EQUIPMENT

(71) Applicant: Fulian Precision Electronics (Tianjin) Co., LTD., Tianjin (CN)

(72) Inventors: Ming-Hua Duan, Tianjin (CN); Ya-Ni Zhang, Tianjin (CN); Han-Yu Li, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 266 days.

(21) Appl. No.: 18/138,029

(22) Filed: Apr. 21, 2023

(65) Prior Publication Data

US 2023/0345636 A1     Oct. 26, 2023

(30) Foreign Application Priority Data

Apr. 22, 2022    (CN) .......................... 202210432113.3

(51) Int. Cl.
*H05K 1/14* (2006.01)

(52) U.S. Cl.
CPC ....... *H05K 1/144* (2013.01); *H05K 2201/042* (2013.01)

(58) Field of Classification Search
CPC ............. H05K 1/144; H05K 2201/042; H05K 2201/2018; H05K 2201/2036; H05K 2201/10409; H05K 7/1402; H05K 7/1405
See application file for complete search history.

(56) References Cited

U.S. PATENT DOCUMENTS

| | | | | |
|---|---|---|---|---|
| 4,297,769 A | * | 11/1981 | Coules ................... | H05K 1/144 174/138 D |
| 4,495,380 A | * | 1/1985 | Ryan ...................... | H05K 7/142 24/453 |
| 4,789,765 A | * | 12/1988 | Berg .................... | H01H 19/626 200/275 |
| 6,058,024 A | * | 5/2000 | Lyford .................... | G01R 1/18 361/752 |
| 6,377,445 B1 | * | 4/2002 | Davis .................... | H05K 7/142 361/752 |
| 6,535,394 B1 | * | 3/2003 | Hirzmann .............. | H05K 7/142 361/753 |
| 2003/0230429 A1 | * | 12/2003 | Chen ..................... | H05K 7/142 174/262 |

(Continued)

FOREIGN PATENT DOCUMENTS

| | | |
|---|---|---|
| CN | 109996387 A | 7/2019 |
| CN | 212305780 U | 1/2021 |
| TW | 201630512 A | 8/2016 |

*Primary Examiner* — Paresh Paghadal

(74) *Attorney, Agent, or Firm* — ScienBiziP, P.C.

(57) ABSTRACT

A fixing auxiliary device includes a support frame, an elastic member, and a plurality of first support members. The first support member includes a first segment, a second segment, and a third segment which are connected in sequence. The third segment is detachably connected to the support frame, the first segment is configured to extend into a first component. An end of the second segment facing away from the third segment includes a first stop surface configured for stopping the first component from moving towards the support frame. The elastic member is configured to provide an elastic force to a second component to press against the support frame.

4 Claims, 6 Drawing Sheets

<u>100</u>

(56)         References Cited

U.S. PATENT DOCUMENTS

| | | | |
|---|---|---|---|
| 2006/0046532 A1* | 3/2006 | Hjort | H01R 12/52 |
| | | | 439/74 |
| 2008/0310138 A1* | 12/2008 | Arends | H05K 7/142 |
| | | | 361/808 |
| 2010/0122458 A1* | 5/2010 | Woods, Jr. | H01R 12/58 |
| | | | 174/262 |
| 2012/0257360 A1* | 10/2012 | Sun | H01R 12/716 |
| | | | 361/748 |
| 2014/0009897 A1* | 1/2014 | Tang | H05K 7/142 |
| | | | 361/752 |
| 2021/0352799 A1* | 11/2021 | Liu | H05K 7/142 |

* cited by examiner

FIXING AUXILIARY DEVICE, FIXING DEVICE, AND ELECTRONIC EQUIPMENT

FIELD

The subject matter herein generally relates to a fixing auxiliary device, a fixing device, and an electronic equipment.

BACKGROUND

At present, in order to achieve a compact layout of a server, a structural design principle of Computer On Module-High Performance Computing (COM-HPC) is adopted, and two-piece upper and lower motherboards are used, which can reduce occupied space. However, during an electrical connection process of the two-piece upper and lower motherboards, it is easy to collide with a connector and cause damages to the connector, and it is not easy to separate the upper and lower motherboards during a disassembly process.

BRIEF DESCRIPTION OF THE DRAWINGS

Implementations of the present disclosure will now be described, by way of embodiments, with reference to the attached figures.

DETAILED DESCRIPTION

Figure 1:
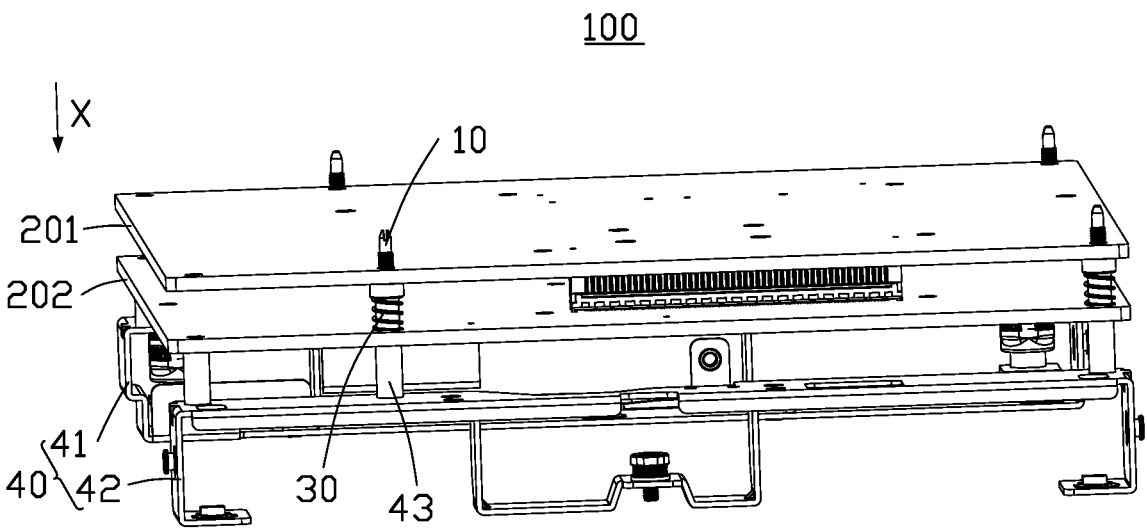
FIG. 1 is perspective view of an embodiment of a fixing auxiliary device according to the present disclosure.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The terminology used herein is for the purpose of describing particular exemplary embodiments only and is not intended to be limiting of the disclosure. As used herein, when a first component is referred to as "connected to" a second component, it is intended that the first component may be directly connected to the second component or may be indirectly connected to the second component via a third component between them. When a first component is referred to as "disposed to" a second component, it is intended that the first component may be directly disposed to the second component or may be indirectly disposed to the second component via a third component between them. The term "comprising" means "including, but not necessarily limited to"; it specifically indicates open-ended inclusion or membership in a so-described combination, group, series, and the like.

Unless otherwise defined, all terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein. The term "and/or" used herein includes any suitable combination of one or more related items listed.

Referring to FIG. 1, a fixing auxiliary device 100 according to an embodiment is provided to solve a problem of inconvenient assembly and disassembly of a first component 201 and a second component 202. The first component 201 and the second component 202 are two-piece upper and lower motherboards designed with COM-HPC structure, the first component 201 is an upper motherboard, and the second piece 202 is a lower motherboard. The fixing auxiliary device 100 can also be suitable for auxiliary fixing of other similar two sheet-shaped components. The upper motherboard and the lower motherboard are arranged at intervals in a first direction X.

Figure 2:
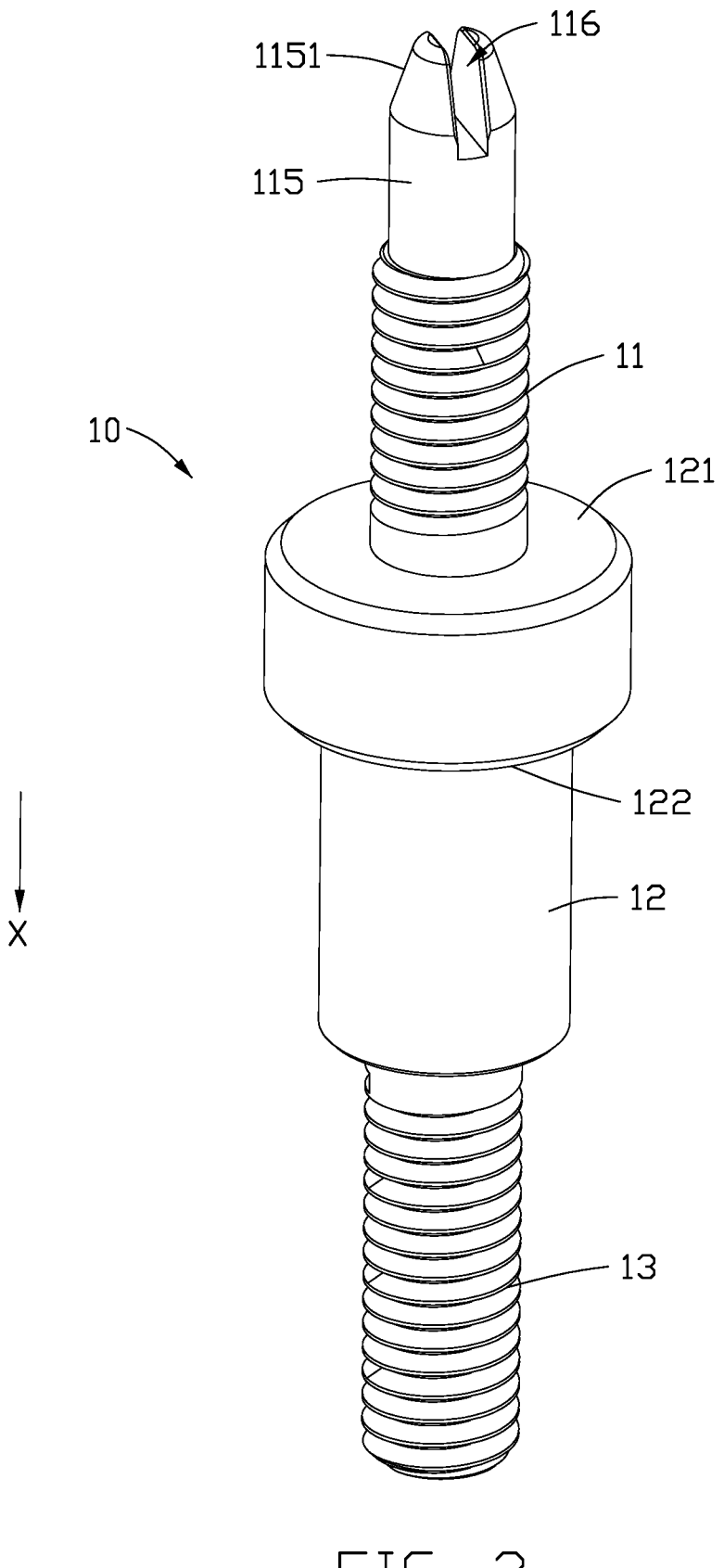
FIG. 2 is a perspective view of a first support member of the fixing auxiliary device of FIG. 1.

Referring to FIG. 2, the fixing auxiliary device 100 includes a support frame 40, a plurality of first support members 10, and an elastic member 30. The first support member 10 includes a first segment 11, a second segment 12, and a third segment 13 connected in sequence in the first direction X. The third segment 13 is detachably connected to the support frame 40. An end of the second segment 12 facing away from the third segment 13 includes a first stop surface 121. The first segment 11 is configured to be inserted into a first mounting hole 2011 of the first component 201 to guide the first component 201 to approach the first stop surface 121 along an extending direction of the first segment 11. The first stop surface 121 is configured to stop the first component 201 from moving towards the support frame 40. The elastic member 30 is configured to abut against the second component 202 to provide a pressure to the second component 202 to compress the support frame 40.

When installing and fixing the first component 201 and the second component 202, first the second component 202 is placed on the support frame 40, then the third segment 13 of first support member 10 extends through a second mounting hole of the second component 202 and is connected to the support frame 40, so that the first support member 10 is fixed to the second component 202. Then the first segment 11 of the first support member 10 extends through the first mounting hole 2011 of the first component 201, so that the first support member 10 is fixed to the first component 201. The elastic member 30 provides an elastic force on the second component 202, so that the second component 202 presses against the supporting frame 40. When disassembling the first component 201 and the second component 202, the second component 202 will not move with the first component 201 and the first support member 10.

In some embodiments, the third segment 13 is substantially cylindrical, and an outer surface of the third segment 13 is provided with external threads. The support frame 40 defines a mounting hole, and a hole wall of the mounting hole has internal threads, and the external thread of the third segment 13 are matched with the internal threads of the support frame 10, so that the third segment 13 is detachably connected to the support frame 40, no other connecting members are needed, the size is small, and the structure is compact.

In other embodiments, the third segment 13 can be detachably connected to the support frame 40 by snap-fit or magnetic attraction. When a means of magnetic attraction is used, a magnet is fixed on the support frame 40, and the outer surface or an inner surface of the third segment 13 is provided with a magnetic member that can be attracted to the magnet. Alternatively, the third segment 13 can be made of a magnetic material, such as steel, iron, etc., so that the support frame 40 is attracted to and fixed to the third segment 13. Specifically, the magnet may be a plate-shaped magnet, a block-shaped magnet, a strip-shaped magnet, a circular magnet, etc., and its specific structure is not limited here. When a means of snap-fit is used, the support frame 40 defines a latching groove, and the third segment 13 is provided with a latching portion, the latching portion engages with the latching groove, so that the support frame 40 is fixed to the third segment 30.

In one embodiment, the elastic member 30 is a U-shaped elastic sheet. The U-shaped elastic sheet is sandwiched between the first component 201 and the second component 202. Specifically, an end of the U-shaped elastic sheet is connected with the first component 201, and the other end is configured to abut against the second component 202 to provide an elastic force for pressing the second component 202 to the support frame 40.

In one embodiment, the elastic member 30 is a rubber spring, and the rubber spring is sandwiched between the first component 201 and the second component 202. Specifically, an end of the rubber spring is connected to the first component 201, and the other end is configured to abut against the second component 202 to provide an elastic force for pressing the second component 202 to the supporting frame 40.

In one embodiment, the elastic member 30 is a compression spring or a hydraulically telescopic sleeve rod, which is sleeved on second segment 12 of the first support member 10 and resists between the second stop surface 122 and the second component 202. The structure is simple and easy to assemble, and no additional fixing of the elastic member 30 is required. The compression spring or the hydraulically telescopic sleeve rod has a short longitudinal length after contraction, takes up less space, and has a compact structure.

Specifically, the compression spring or the hydraulically telescopic sleeve rod is sleeved on the second segment 12 of the first support member 10 and can slide on the second segment 12. In some embodiments, the outer surface of the second segment 12 is smooth, so as to facilitate the sliding of the elastic member 30 on the second segment 12.

In some embodiments, diameters of the first segment 11 and the third segment 13 are the same, which is convenient for manufacturing. At the same time, the diameters of the first segment 11 and the third segment 13 are the same, so that diameters of the first mounting hole 2011 of the first component 201 and the second mounting hole of the second component 202 are also the same, so that manufacturing difficulty of the first mounting hole 2011 of the first component 201 and the second mounting hole of the second piece 202 can be reduced.

In one embodiment, the second segment 12 includes a second stop surface 122. The first stop surface 121 and the second stop surface 122 are arranged along the first direction X. The second stop surface 122 is configured to stop the elastic member 30 from moving along an opposite direction of the first direction X. When the first component 201 and the second component 202 are disassembled, the elastic member 30 sandwiched between the second component 202 and the second stop surface 122 is restored, provides an elastic force in the first direction X to the second component 202 to make the second component 202 to press against the support frame, and provides an elastic force in the direction opposite to the first direction X to the second stop surface 122. The second stop surface 122 allows the first support member 10 and first component 201 to be separated from the second component 202 together, the separation of the first support 10 and the first component 201 can be reduced, and it is convenient to install again without searching the first support member 10, saving time, and improving installation efficiency.

In one embodiment, a plurality of first support members 10 are connected to and evenly arranged on the support frame 40, which can improve the stability of the installation and fixation of the second component 202 and the first component 201.

In one embodiment, the number of the first support members 10 are four, and four first support members 10 are arranged on four corners of the support frame 40, which can improve the stability of the installation and fixation of the second component 202 and the first component 201. In other embodiments, other numbers of first support members 10 may also be provided, and the number of first support members 10 may be set according to actual needs. The first mounting holes 2011 of the first component 201 and the second mounting holes of the second piece 202 are in a one-to-one correspondence with the first support members 10.

In one embodiment, the support frame 40 includes a first support frame 41 and a second support frame 42. The first support frame 41 and the second support frame 42 are arranged in parallel and are respectively arranged at two ends of the second component 202, so as to provide a balanced supporting force for the second component 202.

In one embodiment, the support frame 40 is provided with first connecting rods 43. Each of the first connecting rods 43 has internal threads. The first connecting rods 43 are in a one-to-one correspondence with the first support members 10. The external threads of the third segment 13 is matched with the inner threads of the first connecting rod 43, so that the first support 10 and the support frame 40 are fixed, and the first support 10 and the second component 202 are fixed in the first direction X.

In one embodiment, the first segment 11 is further provided with a guide pillar 115, and the guide pillar 115 is arranged at an end of the first segment 11 facing away from the second segment 12. When the first component 201 is connected to the first support member 10, the guide pillar 115 can quickly extend through the first mounting hole 2011 of the first component 201, so that the first support member 10 is quickly connected to the first component 201.

In one embodiment, cross-sectional areas of the guide pillar 115 perpendicular to the first direction X gradually increases along a direction close to the third segment 13, that is, there is a circular platform 1151 at the end of the guide pillar 115 facing away from the second segment 12. The circular platform 1151 can further facilitate the fast passage of the guide pillar 115 through the first mounting hole 2011 of the first component 201.

In one embodiment, the first segment 11 further defines an operating groove 116. The operating groove 116 is arranged on a surface of the circular platform 1151 facing away from the second segment 12. An opening of the operating groove 116 faces away from the second segment 12. The operating groove 116 is configured to receive an operating tool to cause the first support member 10 to rotate, so as to facilitate the installation and disassembly of the first component 201 and the second component 202.

Specifically, the operating groove 116 is in a shape of a straight line, a cross or a quincunx, and can be designed according to a shape of the operating tool.

Figure 3:
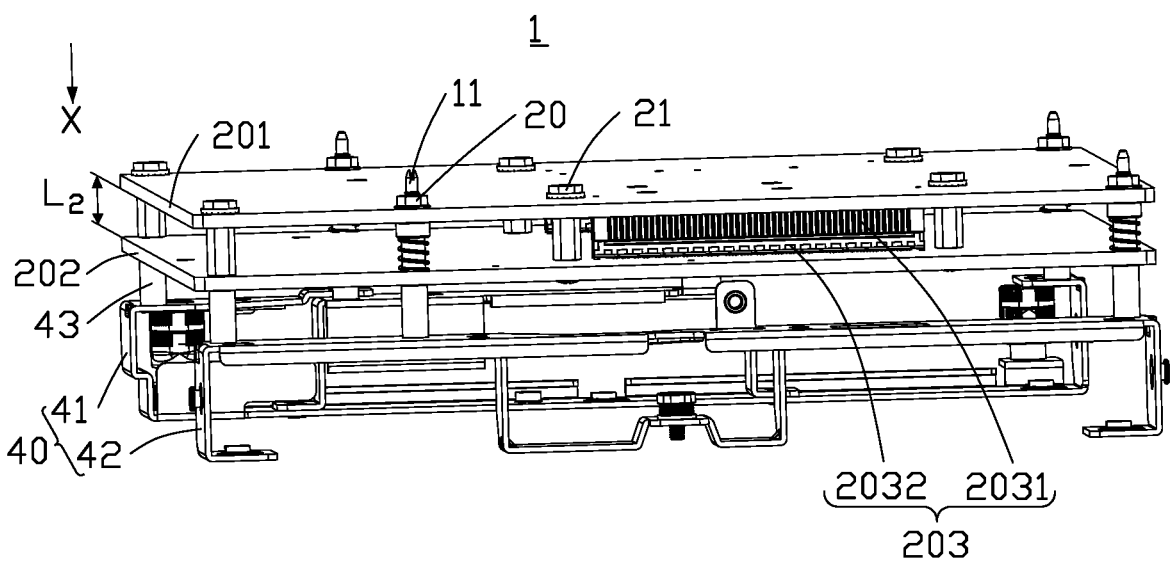
FIG. 3 is a perspective view of an embodiment of a fixing device according to the present disclosure.
Figure 4:
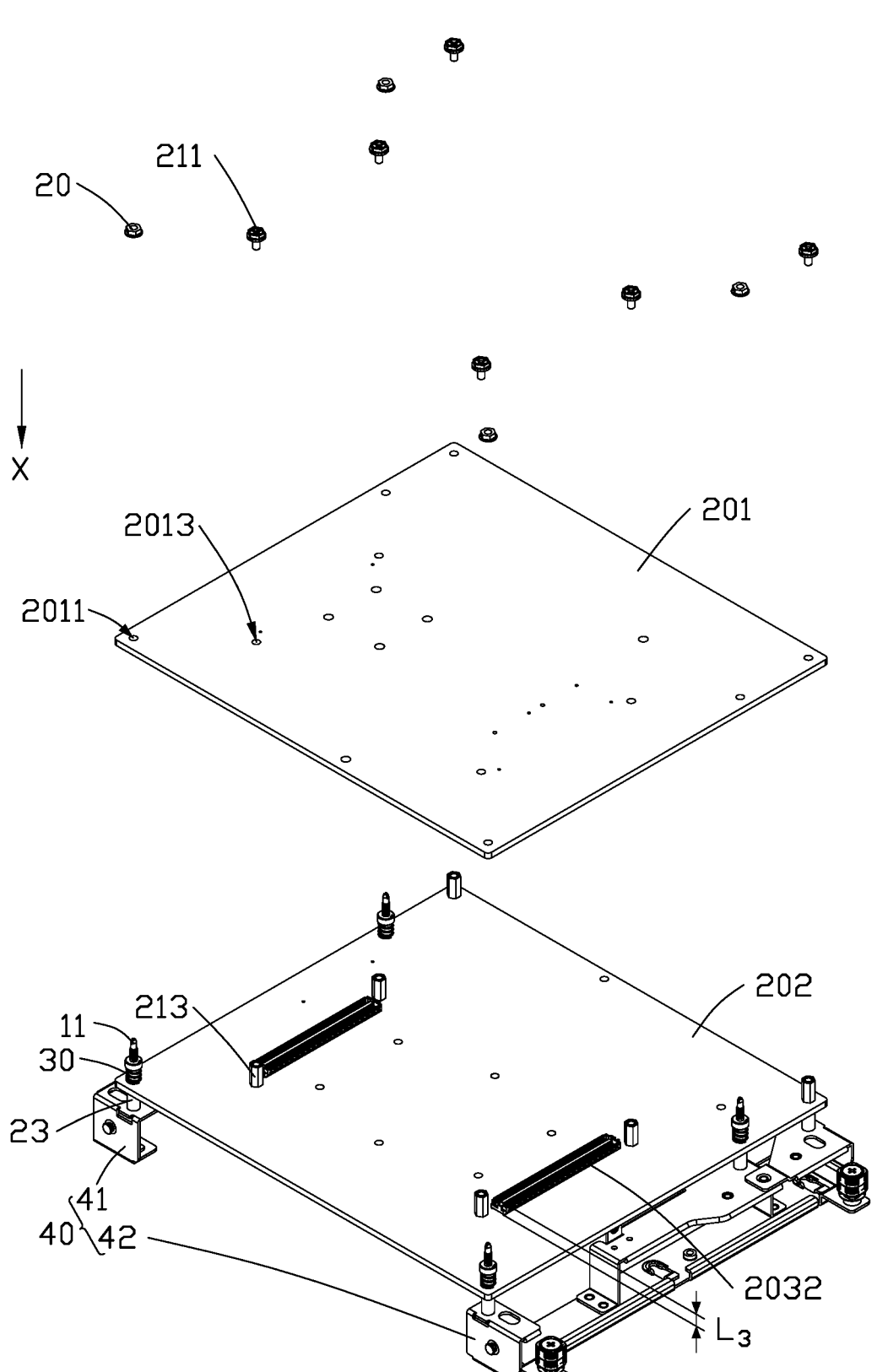
FIG. 4 is an exploded view of the fixing device of FIG. 3.
Figure 5:
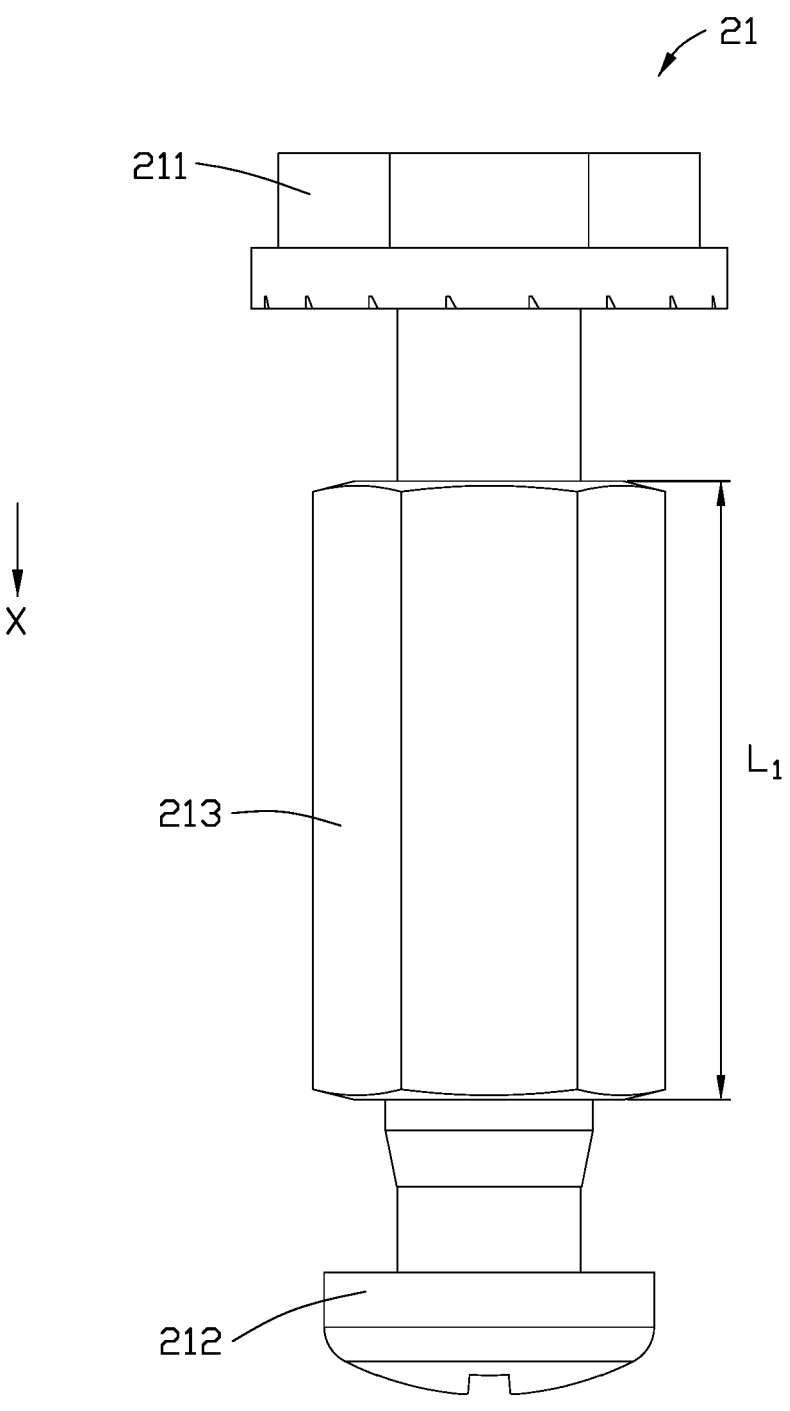
FIG. 5 is a schematic diagram of a second support member of the fixing device of FIG. 3.

Referring to FIGS. 3-5, a fixing device 1 is provided. The fixing device 1 includes the fixing auxiliary device 100 and a plurality of second support members 21. The second support members 21 are configured to fix the first component 201 and the second component 202. The second support member 21 includes a second connecting rod 213, a first fastener 211, and a second fastener 212. The first fastener 211 extends through a third mounting hole 2012 of the first component 201 and cooperates with the second connecting rod 213 to fix the first component 201 and the second support member 21. The second fastener 212 extends through a fourth mounting hole of the second component 202 and cooperates with the second connecting rod 213 to fix the second component 202 and the second support member 21. A length of the second connecting rod 213 in the first direction X is L, a distance between the first component 201 and the second component 202 during installation is L2, where L1≤L2, so as not to hinder the installation of the first component 201 and the second component.

In one embodiment, the first fastener 211 and the second fastener 212 have the same structure, which is convenient for manufacturing. Furthermore, the third mounting hole 2012 of the first component 201 and the fourth mounting hole of the second component 202 have the same diameter, which is convenient for manufacturing and further reduces the difficulty of manufacturing.

In one embodiment, the first fastener 211 and the second fastener 212 are screws.

In one embodiment, a connector 203 electrically connecting the first component 201 and the second component 202 includes a first connecting member 2031 and a second connecting member 2032. The first connecting member 2031 is arranged on the first component 201, the second connecting member 2031 is arranged on the second component 202, the first connecting member 2031 is matched with and electrically connected to the second connecting member 2032, so that the first component 201 is electrically connected to the second component 202. A length of the second connecting member 203 in the first direction is L3. In one embodiment, in an extending direction of the second connecting member 2032, two second support members 21 are respectively arranged near both ends of the second connecting member 2032, which facilitates the protection of the second connecting member 2032. In one embodiment, L3<L1≤L2, and the second connecting rod 213 is higher than the second connecting member 2032 in the first direction X, which can protect the second connecting member 2032 from colliding with other objects in the first direction X.

Figure 6:
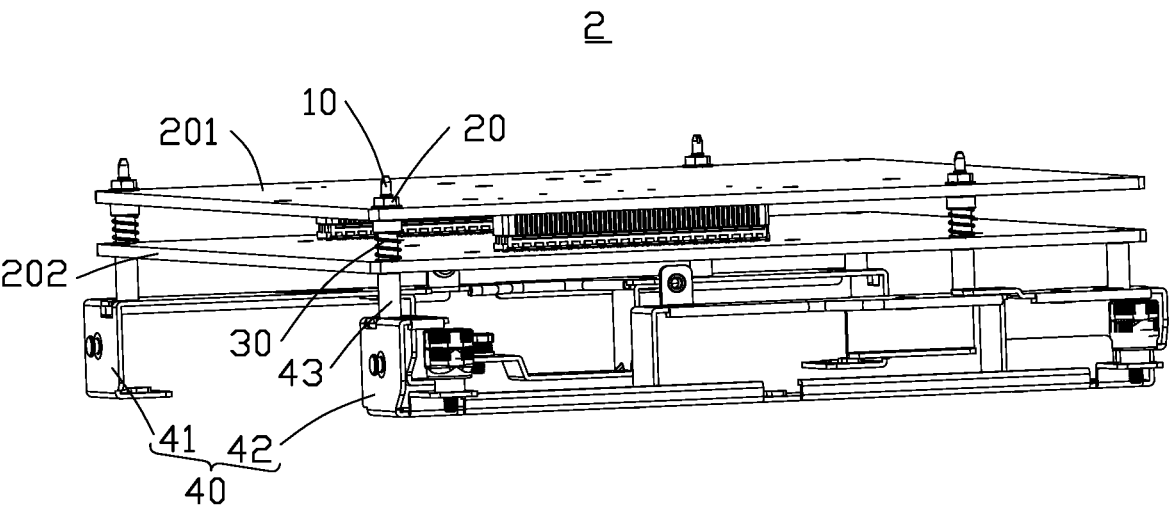
FIG. 6 is a perspective view of another embodiment of a fixing device according to the present disclosure.

Referring to FIG. 6, in one embodiment, the fixing device 1 further includes a third fastener 20. The third fastener 20 is matched with the first segment 11 and configured to limit the moving distance of the first component 201 relative to the second component 202 in the first direction X.

In one embodiment, the first segment 11 is provided with external threads, the third fastener 20 is a screw nut. The first segment 11 is screwed into the screw nut.

Processes for installing and fixing the first component 201 and the second component 202 through the fixing device 1 are as follows.

First, the second fastener 212 extends through the fourth mounting hole of the second component 202 and is connected to the second connecting rod 213, so that the second support member 21 is connected to the second component 202. Then, the second component 202 is placed on the support frame 40, the elastic member 30 is sleeved on the third segment 13 of the first support member 10, the third segment 13 extends through the second mounting hole of the second component 202 to threadedly engages with the first connecting rod 43, so that the second component 202 is fixed to the first support member 10. Then, the guide pillar 115 quickly guide the first segment 11 to extend through the first mounting hole 2011 of the first component 201, so that the first component 201 is fixed to the first support member 10. Finally, the first fastener 211 extends through the third mounting hole 2012 of the first component 201 and is connected to the second connecting rod, the third fastener 20 is sleeved on and tightened to the first segment 11.

Steps of disassembling the first component 201 and the second component 202 which are connected through the fixing device 1 are as follows.

First, the first fastener 211 is removed to disconnect the connection between the first fastener 211 and the second connecting rod 213. Then, the operating tool is inserted into the operating groove 116 to cause the first support 10 to rotate, the first support 10 is disengaged from the first connecting rod 43, and the elastic member 30 restores and provides an elastic force to the second component 202 to press against the support frame 40, so that the second component 202 will not move the first support member 10 and the first component 201 during the separation process of the first component 201 and the second component 202.

At the same time, the first support member 10 and first component 201 are separated from the second component 202 together, the first support 10 will be not separated from the first component 201, which is convenient to install again without searching the first support member 10, saving time, and improving installation efficiency.

Referring to FIGS. 1, 2, and 6, in one embodiment, the fixing device 2 includes the fixing auxiliary device 100 and a plurality of third fasteners 20. The fasteners 20 are matched with the first segments 11 and configured to limit the moving distance of the first component 201 relative to the second component 202 in the first direction X.

In one embodiment, the first segment 11 is provided with external threads, the third fasteners 20 are screw nuts. The first segment 11 is screwed into the screw nuts.

When installing and fixing of first component 201 and the second component 202, first the second component 202 is placed on the support frame 40, the elastic member 30 is sleeved on the third segment 13 of the first support member 10, the third segment 13 extends through the second mounting hole of the second component 202 to threadedly engages with the first connecting rod 43, so that the second component 202 is fixed to the first support member 10. Then the guide pillar 115 quickly guide the first segment 11 to extend through the first mounting hole 2011 of the first component 201, so that the first component 201 is fixed to the first support member 10. Finally, the third fasteners 20 are sleeved on and tightened to the first segments 11, so that the first component 201 is fixed to the second component 202 by the fixing device 2.

When disassembling the first component 201 and the second component 202, the operating tool is inserted into the operating groove 116 to cause the first support 10 to rotate, the first support 10 is disengaged from the first connecting rod 43, and the elastic member 30 restores and provides an elastic force to the second component 202 to press against the support frame 40, so that the second component 202 will not move the first support member 10 and the first component 201 during the separation process of the first component 201 and the second component 202.

An electronic equipment according to an embodiment is provided. The electronic equipment includes the fixing device 1 or the fixing device 2, the first component 201, and the second component 202. The electronic equipment can be, but is not limited to, a personal computer or a server.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims.

What is claimed is:

1. A fixing auxiliary device comprising:

a support frame comprising a plurality of first connecting rods disposed on a surface thereof;

a plurality of first support members, wherein each of the plurality of first support members comprises a first segment, a second segment, and a third segment which are connected in sequence in a first direction, the third segment has external threads, each of the plurality of first connecting rods has internal threads that match the external threads, the third segment is detachably connected to the support frame through the external threads and the internal threads, the first segment is configured to extend into a first component, an end of the second segment facing away from the third segment comprises a first stop surface configured for stopping the first component from moving towards the support frame, the third segment is configured to extend into a second component; and an elastic member, wherein the second segment further comprises a second stop surface, the first stop surface and the second stop surface are arranged along the first direction, the elastic member is a compression spring, the compression spring is sleeved on the second segment and abuts between the second stop surface and the second component to provide an elastic force to the second component to press against the support frame.

2. The fixing auxiliary device of claim 1, wherein the first segment is provided with a guide pillar, the first guide pillar is arranged at an end of the first segment facing away from the second segment and configured for guiding the first segment to extend into the first component.

3. The fixing auxiliary device of claim 2, wherein a cross-sectional area of the guide pillar increases in a direction from the first segment to the third segment.

4. The fixing auxiliary device of claim 1, wherein a surface of the first segment facing away from the second segment defines an operating groove, the operating groove is configured to receive an operating tool to cause a corresponding first support member of the plurality of first support members to rotate.

* * * * *